United States Patent
Dray et al.

(10) Patent No.: US 6,940,119 B2
(45) Date of Patent: Sep. 6, 2005

(54) NON-VOLATILE PROGRAMMABLE AND ELECTRICALLY ERASABLE MEMORY WITH A SINGLE LAYER OF GATE MATERIAL

(75) Inventors: Cyrille Dray, Eybens (FR); Phillipe Gendrier, Grenoble (FR); Richard Fournel, Lumbin (FR)

(73) Assignee: STMicroelectronics SA, Montrouge (FR)

( * ) Notice: Subject to any disclaimer, the term of this patent is extended or adjusted under 35 U.S.C. 154(b) by 212 days.

(21) Appl. No.: 10/383,153

(22) Filed: Mar. 6, 2003

(65) Prior Publication Data
US 2004/0062108 A1 Apr. 1, 2004

(30) Foreign Application Priority Data
Mar. 6, 2002 (FR) .............................. 02 02853

(51) Int. Cl.[7] ...................... H01L 29/76; H01L 21/336
(52) U.S. Cl. ...................... 257/314; 438/257
(58) Field of Search ............... 257/288, 314, 257/315; 438/197, 257

(56) References Cited

U.S. PATENT DOCUMENTS

| | | | |
|---|---|---|---|
| 5,309,009 A | 5/1994 | Chao | 257/318 |
| 5,761,121 A | 6/1998 | Chang | 365/185.14 |
| 6,326,663 B1 * | 12/2001 | Li et al. | 257/318 |
| 6,538,275 B2 * | 3/2003 | Sugiyama et al. | 257/314 |

FOREIGN PATENT DOCUMENTS

EP WO94/00881 1/1994 .......... H01L/29/78

* cited by examiner

*Primary Examiner*—Michael Lebentritt
*Assistant Examiner*—Scott B. Geyer
(74) *Attorney, Agent, or Firm*—Lisa K. Jorgenson; Allen, Dyer, Doppelt, Milbrath & Gilchrist, P.A.

(57) ABSTRACT

The semiconducting memory device comprises a non-volatile programmable and electrically erasable memory cell with a single layer of grid material and comprising a floating grid transistor and a control grid, within an active semiconducting area formed in a region of the substrate and delimited by an isolation region. The layer of grid material EG, FL P2 in which the floating grid FG is made extends integrall above the active area ZA without overlapping part of the isolation region STI, and the transistor is electrically isolated from the control grid CG by PN junctions that will be reverse biased.

35 Claims, 3 Drawing Sheets

NON-VOLATILE PROGRAMMABLE AND ELECTRICALLY ERASABLE MEMORY WITH A SINGLE LAYER OF GATE MATERIAL

FIELD OF THE INVENTION

The present invention relates to integrated circuits, and more particularly to semiconductor devices of the non-volatile, programmable and electrically erasable memory type with a single layer of gate material.

BACKGROUND OF THE INVENTION

U.S. Pat. No. 5,761,121 discloses an example of a PMOS non-volatile, programmable and electrically erasable memory. The structure of this type of memory is well known to persons skilled in the art. More precisely, this type of cell includes a floating gate transistor and a control gate made by implantation within a semiconductor substrate. This buried layer that acts as a control gate is capacitively coupled to the floating gate. The control gate and the floating gate transistor are electrically isolated by an isolation area, for example of the STI (Shallow Trench Isolation) type.

The layer of gate material, usually polysilicon, within which the transistor floating gate is made, is isolated from the active area by a dielectric, for example made of silicon dioxide. It has been observed that it is advisable to use a dielectric not more than 60 Å thick so as to achieve good data retention. It has been observed that the gate dielectric is thinner at the interface between the isolation area, for example of the STI type, and the gate material. The result is then a data retention problem.

SUMMARY OF THE INVENTION

An object of the invention is to provide a solution to this problem, and provide such a memory for which the manufacturing process is fully compatible with a conventional CMOS manufacturing process.

Therefore, the invention provides a semiconductor memory device comprising a non-volatile programmable and electrically erasable memory cell with a single layer of gate material and comprising a floating gate transistor and a control gate, within an active semiconductor area formed in a region of the substrate and delimited by an isolation region. According to one general characteristic of the invention, the layer of gate material in which the floating gate is made extends integrally above the active area without overlapping part of the isolation region. Furthermore, the transistor is electrically isolated from the control gate by PN junctions that will be reverse biased.

In other words, the active area in this case is made from a single portion, unlike the prior art in which it was made from multiple portions separated and isolated by isolation regions. The fact that the layer of gate material extends integrally above the active area without overlapping part of the isolation region prevents the problem of local thinning of the gate dielectric. Furthermore, the electrical isolation between the control gate and the transistor that was obtained by an isolation region in the prior art is obtained in this case by reverse biased PN junctions.

According to one embodiment of the invention, the floating gate transistor inside the active area that is also called the "storage transistor" in this case, is electrically isolated from the control gate by a bipolar transistor that will be continuously blocked and for which the type of conductivity of the base is not the same as the type of conductivity of the transistor channel. In this respect, the base region of the bipolar transistor may for example be a part of the substrate region.

One approach for preventing the floating gate of the storage transistor from projecting beyond the active area and consequently overlapping part of the isolation region is to provide an annular gate. More precisely, according to one embodiment of the invention, the active area comprises a first semiconductor region with a first type of conductivity, and a second semiconductor region with a second type of conductivity different from the first. The transistor is made in the first semiconductor region and has an annular floating gate including an annular part of the polysilicon region of the gate. The control gate is made in the second semiconductor region, and the region of the gate material comprises a second part located above the control gate and a connecting part connecting the annular part and the second part.

The fact that electrical isolation is provided in the active area between the storage transistor and the control gate through PN junctions creates a parasitic MOS transistor, for which the gate is formed by the connecting part of the layer of gate material. In this case, the transverse dimension of the connecting part can be adjusted depending on the etching fineness of the technology, in this case to limit current consumption when the memory cell is being erased.

Another approach includes making a specifically implanted area located under the connecting part, so as to reduce the threshold voltage of the parasitic transistor formed between the storage transistor and the control gate.

According to another embodiment of the invention, the substrate region is formed from a main semiconductor box with the first type of conductivity (for example an N box) and incorporating the first semiconductor region of the active area. The main box contains a secondary box with the second type of conductivity (for example a P box) and incorporating the second semiconductor region of the active area. Outside the active area, the storage transistor is electrically isolated from the control gate by box PN junctions. Providing electrical isolation through box PN junctions is particularly advantageous, since this type of junction gives better behavior in inverse voltage.

According to one embodiment of the invention, the device also comprises polarization means with a memory cell programming state, a memory cell read state, and a memory cell erase state. In each of the states, the biasing means are capable of applying predetermined voltages to the source, the drain and the substrate (main box) of the storage transistor and the control gate.

Furthermore, the highest absolute value of the voltage applied to the storage transistor substrate is obtained for an N type substrate, or the lower absolute value is obtained for a P type substrate, in each state. This guarantees that the isolation bipolar transistor is blocked. Furthermore, in the programming state, a voltage equal to the substrate voltage is preferably applied to the control gate. This thus limits the electrical stress on the PN junction of the box. Furthermore, the quantity of injected charges is greater. Furthermore, in the read state, it will be advantageous to choose a drain/source voltage difference limited to an absolute value of 1 volt. This prevents very slow reprogramming of the memory cell, or unwanted parasite programming of a blank memory cell.

The floating gate storage transistor is preferably a PMOS transistor. In this case, the invention is also applicable to an NMOS type storage transistor. The device may comprise a memory plane comprising several memory cells. The device may thus form an EEPROM or FLASH type memory. The invention also includes an integrated circuit comprising a device as discussed above. Other advantages and characteristics of the invention will become clear after reviewing the detailed description and the appended drawings of non-restrictive embodiments.

BRIEF DESCRIPTION OF THE DRAWINGS

FIGS. 1a to 3a diagrammatically represent electrical isolations by PN junctions according to the invention.

DETAILED DESCRIPTION OF THE PREFERRED EMBODIMENTS

Figures 1, 2, 3:
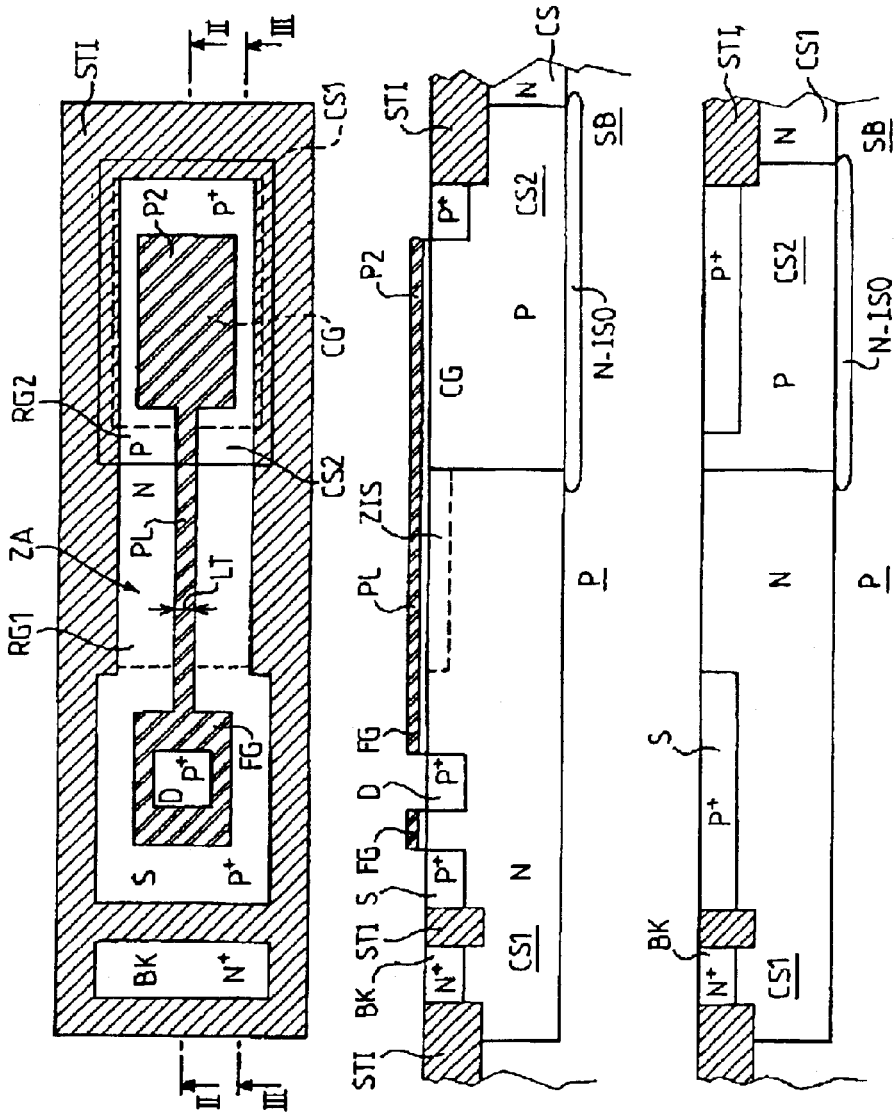
FIGS. 1 to 3 diagrammatically illustrate an embodiment of a memory device according to the invention.
Figures 1A, 2A, 3A:
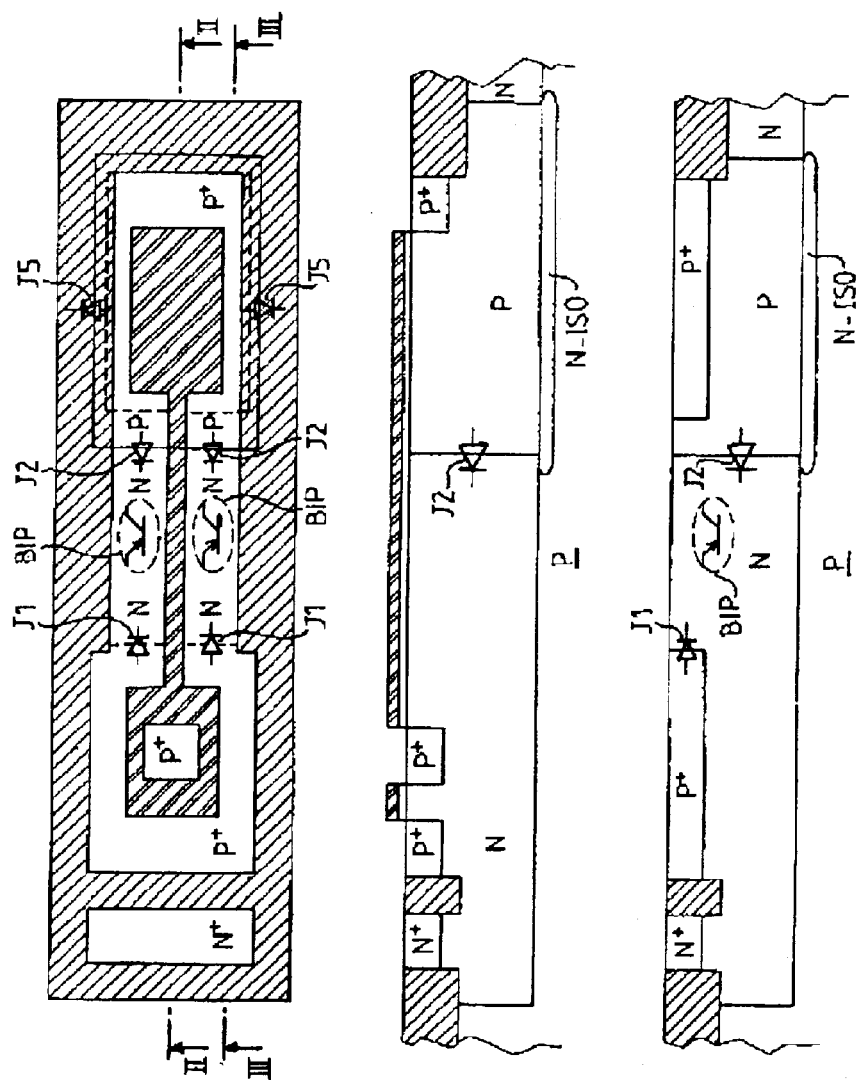

In FIGS. 2 and 3, which are sections along lines II—II and III—III in FIG. 1 respectively, the reference SB denotes a semiconducting substrate, for example a $P^-$ doped silicon substrate. An active area ZA is formed in this substrate SB as a single portion, delimited at the sides by an STI isolation region, for example in this case a shallow trench type isolation region. This active area ZA comprises a first semiconducting region with N type of conductivity, incorporated within a first semiconducting box, or main box, CS1, formed in the substrate SB.

The active area ZA also comprises a second semiconducting region RG2 with P type of conductivity and incorporated within a second semiconducting box or a secondary box, CS2, formed in the main box CS1. The box CS2 is isolated from the rest of the substrate SB by an N-ISO buried layer with the N type of conductivity. The box CS1 also comprises an implanted $N^+$ type area referenced BK, enabling a contact so as to polarise the box CS1. A layer of gate material, for example polysilicon, is provided above the active area, supported on the upper surface of the active area ZA through a gate oxide, for example silicon dioxide.

This single layer of gate material extends above the active area ZA without overlapping any part of the isolation area STI at any location. The layer of gate material, which as a whole forms a floating gate, comprises a first annular part FG located above the box SC1. This first part of the gate material defines the gate FG of a transistor for which the source S, formed from a $P^+$ type implanted region is located in the box SC1 outside the floating gate, and for which the drain D, also formed in a $P^+$ type implanted region, is located in the box CS1 inside the ring forming the gate FG.

The PMOS transistor thus formed is also called the memory cell charge storage transistor in the remainder of this description. The layer of gate material also comprises a second part P2, in this case rectangular, which is vertically above the box CS2. The region of the box CS2 located under the second part P2 of the layer of gate material forms the control gate CG of the memory cell. This control gate is therefore capacitively coupled to the gate FG through the second part P2 of this layer of gate material and through a connecting part PL of the layer of gate material connecting the gate FG and the second part P2.

To enable a contact to allow appropriate biasing of the control gate CG, the box CS2 comprises a $p^{30}$ implanted region located around the second part P2. Note in this case that the shape of the second part P2 of the layer of gate material may be arbitrary. In this case it was shown as being rectangular and wider than the connecting part PL. It could be the same width as the connecting part PL, or it could have a different shape, for example an H shape.

In operation, the control gate CG should be electrically isolated from the floating gate storage transistor. This is done using PN junctions that will be reverse biased and are shown diagrammatically in FIGS. 1a to 3a which are similar to FIGS. 1 to 3. In these figures, it can be seen that inside the active area ZA, the floating gate transistor is isolated from the control gate by first PN junctions J1 formed between the transistor source region and the box CS1 with N type of conductivity, and by PN junctions J2 formed between the box CS2 and the box CS1.

A person skilled in the art will appreciate that these two junction types J1 and J2 in combination form a bipolar transistor BIP, which as will be described in more detail later, is continuously blocked or inhibited, regardless of the operating state of the memory cell. The electrical isolation between the floating gate transistor and the control gate is thus made inside the active area. The lateral isolation between the floating gate transistor and the control gate CG is also made by PN junctions that will be reverse biased. More precisely, these junctions contain box junctions J5 formed between the box CS2 and the box CS1.

The manufacturing process for such a memory cell comprising a PMOS type floating gate transistor and a PNP type BIP bipolar isolation transistor, comprises firstly the formation of lateral STI isolation regions in the P type substrate SB, in a known manner. Boxes CS1 and CS2 are then implanted in a known manner, followed by formation of the buried N-ISO isolating layer. Then, after making an oxide layer on the surface of the active area ZA, a layer of gate material is deposited and is etched so as to form the floating gate of the transistor, the connecting part PL and the second part P2, in this layer of gate material. The next step is de-oxidation, followed by production of the various $P^+$ implanted regions formed in the boxes CS1 and CS2. The $N^+$ doped area BK is also produced by implantation.

The next step is conventional silicidation of source and drain regions, and the $P^+$ contact of the control gate, however in this example embodiment using an appropriate mask to be sure not to apply silicide to the floating gate or the surface junctions of the active area ZA. This prevents any metallic short circuit. Furthermore, data retention is better since silicide is not applied to the floating gate. The manufacturing process is then terminated by conventional contact on the source S, drain D regions, on the BK region and on the control gate CG.

Figure 4:
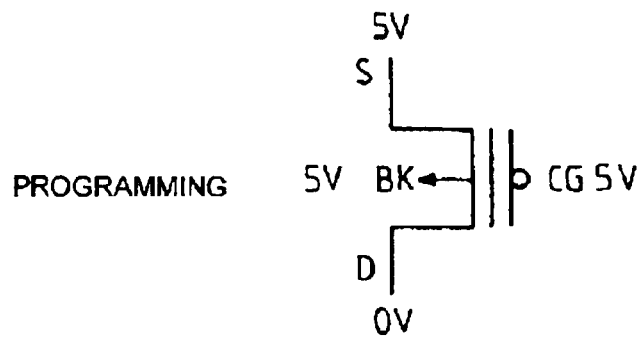
FIG. 4 diagrammatically illustrates biasings applied to the electrodes of a memory device according to the invention, as a function of the state of this device.
Figure 4:
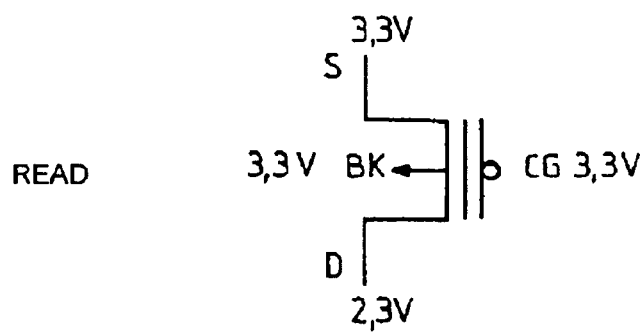
Figure 4:
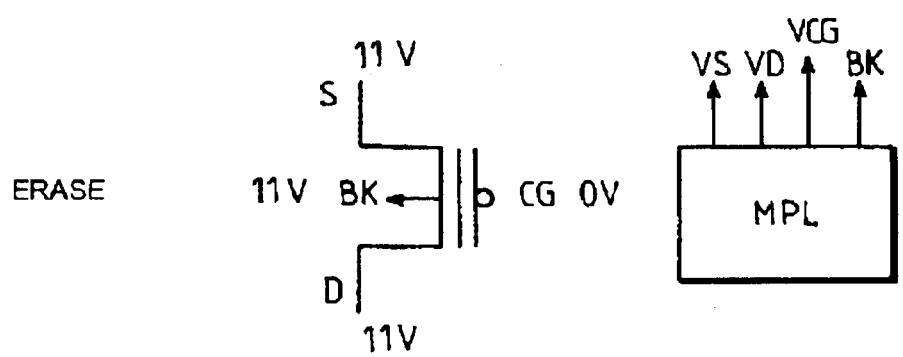

Operation of the memory cell according to the invention will now be described, particularly with reference to FIG. 4. In this respect, the memory device according to the invention comprises MPL biasing means, for example voltage sources associated with a control logic, these polarization means having a programming state of the memory cell, a read state of this memory cell and an erase state of this memory cell. In each state, the polarization means are capable of applying predetermined voltages on the source, drain and substrate of the storage transistor (in this case the substrate being formed from the box CS1) an on the control gate.

When it is required to electrically program the memory cell, in other words to store charges in the floating gate, a voltage equal for example to 5 volts may be applied to the storage transistor source and a voltage equal to 0 volt may be applied to the drain. Furthermore, the transistor substrate is polarized at 5 volts and a voltage variable for example between 0 and 5 volts is applied to the control gate.

The storage transistor is then conducting (provided that the applied gate/source voltage is sufficiently high to initialize conduction of the storage transistor) which creates saturation of this transistor and causes a current of holes from the source. These holes come into collision with the crystalline network and form hot holes and hot electrons. The hot electrons are drawn into the floating gate, for which the potential drops slightly compared with the potential applied to the control gate.

In this case, note that as the gate/source voltage reduces, the potential of the floating gate will increase with respect to the drain, and the electrical field attracting hot electrons into the floating gate will also be higher. It is then possible to make a compromise between the current intensity and the electric field intensity. Consequently, the voltage VCG applied to the control gate will preferably be chosen to be equal to the voltage VBK applied to the substrate, so as to minimize the electrical stress on the diode of box J5, and also enable greater injection of charges.

Furthermore, it will be observed that in this state, the absolute value of the voltage VBK applied to the transistor substrate is equal to the highest voltage. Since the base of the bipolar isolation transistor BIP is a part of the substrate, the transistor BIP is in its blocked state. In the read state, the drain/source voltage difference is deliberately limited to −1 volt, so as to prevent very slow reprogramming of the memory cell. For example, we will thus choose a voltage on the source of 3.3 volts and a voltage on the drain of 2.3 volts. The substrate BK will be polarized at 3.3 volts and the control gate CG can be polarized at a voltage varying between 0 and 3.3 volts.

Thus, if zero was programmed in the memory cell during programming, in other words if no other programming was done, the transistor will be blocked during reading. However, if (for example) we programmed a "1" in the programming state in the memory cell, in other words if charges were stored in the floating gate, the transistor will be conducting during reading. Thus, the logical value that was written or programmed in the cell can be determined by detecting whether or not there is a current in the read state. Once again, in this read state, the voltage applied to the transistor substrate is the highest, which blocks the bipolar isolating transistor BIP, thus forming electrical isolation with the control gate within the active area.

To electrically erase the memory cell, voltages for example equal to 11 volts are applied to the source, the drain and the substrate, and a voltage of 0 volt is applied to the control gate, which leads to a voltage of about 1 volt on the floating gate. The result is an inversion of the electrical field and therefore evacuation of electrons. In this case, note that there is almost no current consumption, since the voltage on the source is equal to the voltage on the drain. Having said this, referring once again particularly to FIGS. 1 and 2, it can be seen that the structure of this memory cell causes the formation of a parasitic MOS transistor firstly between the P$^+$ doped source and drain regions of the floating gate transistor, and secondly the P doped box CS2. The channel of this parasitic transistor is formed in the N doped box CS1, under the connecting part PL of the layer of gate material. The result is then a parasitic leakage current while the memory cell is being erased, due to conduction of this parasite MOS transistor under large gate/source voltage differences.

Several approaches can then be adopted to minimize current consumption. One of them includes minimizing the transverse dimension LT of the part of the link PL, in other words, the width of the channel of this parasite transistor. Consequently, we will choose a transverse dimension LT equal to the fineness of the etching used in the technology used. Thus, a width LT equal to 0.18 $\mu$m will be chosen for a 0.18 $\mu$m technology.

Another approach, which is not incompatible with the first solution, includes modifying the threshold voltage of this parasitic transistor, by a specific ZIS implantation before forming the layer of gate material. This is done in an attempt to modify doping of the box CS1 in this area, so as to modify the threshold voltage of the parasite MOS transistor and to limit conduction of this parasitic transistor. Note also that the fact that the use of a voltage VCG equal to the voltage VBK in the programming state minimizes the conducting current of this parasite transistor in the programming state.

Although the non-volatile programmable and electrically erasable memory cell that has just been described uses a PMOS transistor, it would also be possible to use an NMOS transistor. Furthermore, several memory cells could be used so as to form a memory plane that can be erasable bit by bit to form an EEPROM type memory, or a memory erasable by bank or by page, so as to form a FLASH type memory.

That which is claimed is:

1. A semiconductor memory device comprising:
a substrate; and
a non-volatile programmable and electrically erasable memory cell including
an active area in the substrate,
an isolation region defining the active area,
a floating gate transistor in the active area,
a single layer of gate material defining a floating gate of the floating gate transistor, and a control gate, and extending above the active area without overlapping the isolation region, and
reverse biased PN junctions in the active area to electrically isolate the floating gate transistor from the control gate.

2. The semiconductor memory device according to claim 1, wherein the reverse biased PN junctions in the active area define a continuously blocked bipolar transistor having a base with the opposite type of conductivity as a channel of the floating gate transistor.

3. The semiconductor memory device according to claim 2, wherein a portion of the substrate defines the base of the bipolar transistor.

4. The semiconductor memory device according to claim 1, wherein the active area comprises a first semiconductor region with a first type of conductivity, and a second semiconductor region with a second type of conductivity different from the first type of conductivity; wherein the floating gate transistor is in the first semiconductor region and has an annular gate including an annular part of the layer of gate material; wherein the control gate is in the second semiconductor region; and wherein the layer of gate material comprises a second part above the control gate and a connecting part connecting the annular part and the second part.

5. The semiconductor memory device according to claim 4, wherein a source and a drain of the floating gate transistor are defined by areas with the second type of conductivity and within the first semiconductor region; and wherein the connecting part has a transverse dimension defined by an etching fineness of a manufacturing method.

6. The semiconductor memory device according to claim 4, wherein a source and a drain of the floating gate transistor are defined by areas with the second type of conductivity and within the first semiconductor region; and further comprising a parasitic transistor between the floating gate transistor and the control gate, and a specific implanted area in the first semiconductor region under the connecting part to modify a threshold voltage of the parasitic transistor.

7. The semiconductor memory device according to claim 4, further comprising a main semiconductor box with the first type of conductivity and incorporating the first semiconductor region of the active area, the main semiconductor box containing a secondary semiconductor box with the second type of conductivity and incorporating the second semiconductor region of the active area, and wherein the PN junctions electrically isolating the floating gate transistor from the control gate comprise PN junctions between the main and secondary semiconductor boxes.

8. The semiconductor memory device according to claim 1, further comprising biasing means with a memory cell programming state, a memory cell read state, and a memory cell erase state, to apply predetermined voltages to the source, the drain and the substrate of the floating gate transistor and the control gate, wherein a highest absolute value of the voltage applied to the floating gate transistor substrate is used for an N type substrate, and a lower absolute value is used for a P type substrate.

9. The semiconductor memory device according to claim 8, wherein the voltage applied to the control gate in the programming state is equal to a substrate voltage.

10. The semiconductor memory device according to claim 8, wherein a difference between the drain and source voltages, in the read state, is limited to an absolute value of 1 volt.

11. The semiconductor memory device according to claim 1, wherein the floating gate transistor comprises a PMOS transistor.

12. A semiconductor memory device comprising:
a substrate; and
a memory array comprising a plurality of non-volatile programmable and electrically erasable memory cells each including
an active area in the substrate,
an isolation region defining the active area,
a floating gate transistor in the active area,
a single layer of gate material defining a floating gate and a control gate, and extending above the active area, and
PN junctions in the active area electrically isolating the floating gate transistor from the control gate.

13. The semiconductor memory device according to claim 12, further comprising reverse biased PN junctions in the active area that define a continuously blocked bipolar transistor having a base with the opposite type of conductivity as a channel of the floating gate transistor.

14. The semiconductor memory device according to claim 13, wherein a portion of the substrate defines the base of the bipolar transistor.

15. The semiconductor memory device according to claim 12, wherein the active area comprises a first semiconductor region with a first type of conductivity, and a second semiconductor region with a second type of conductivity different from the first type of conductivity; wherein the floating gate transistor is in the first semiconductor region and has an annular gate including an annular part of the layer of gate material; wherein the control gate is in the second semiconductor region; and wherein the layer of gate material comprises a second part above the control gate and a connecting part connecting the annular part and the second part.

16. The semiconductor memory device according to claim 15, wherein a source and a drain of the floating gate transistor are defined by areas with the second type of conductivity and within the first semiconductor region; and wherein the connecting part has a transverse dimension defined by an etching fineness of a manufacturing method.

17. The semiconductor memory device according to claim 15, wherein a source and a drain of the floating gate transistor are defined by areas with the second type of conductivity and within the first semiconductor region; and further comprising a parasitic transistor between the floating gate transistor and the control gate, and a specific implanted area in the first semiconductor region under the connecting part to modify a threshold voltage of the parasitic transistor.

18. The semiconductor memory device according to claim 15, further comprising a main semiconductor box with the first type of conductivity and incorporating the first semiconductor region of the active area, the main semiconductor box containing a secondary semiconductor box with the second type of conductivity and incorporating the second semiconductor region of the active area, and wherein the PN junctions electrically isolating the floating gate transistor from the control gate comprise PN junctions between the main and secondary semiconductor boxes.

19. The semiconductor memory device according to claim 12, further comprising a biasing unit with a memory cell programming state, a memory cell read state, and a memory cell erase state, to apply predetermined voltages to the source the drain and the substrate of the floating gate transistor and the control gate, wherein a highest absolute value of the voltage applied to the floating gate transistor substrate is used for an N type substrate, and a lower absolute value is used for a P type substrate.

20. The semiconductor memory device according to claim 19, wherein the voltage applied to the control gate in the programming state is equal to a substrate voltage.

21. The semiconductor memory device according claim 19, wherein a difference between the drain and source voltages, in the read state, is limited to an absolute value of 1 volt.

22. The semiconductor memory device according to claim 12, wherein the floating gate transistor comprises a PMOS transistor.

23. The semiconductor memory device according to claim 12, wherein the memory device is one of an EEPROM and a FLASH type memory.

24. A method of making a semiconductor memory device comprising:
providing a substrate; and
forming at least one non-volatile programmable and electrically erasable memory cell including
forming an isolation region to define an active area in the substrate,
forming a floating gate transistor in the active area,
forming a single layer of gate material to define a floating gate of the floating gate transistor, and a control gate, and extending above the active area without overlapping the isolation region, and
electrically isolating the floating gate transistor from the control gate with PN junctions in the active area.

25. The method according to claim 24, wherein the PN junctions in the active area are reverse biased to define a continuously blocked bipolar transistor having a base with the opposite type of conductivity as a channel of the floating gate transistor.

26. The method according to claim 25, wherein a portion of the substrate defines the base of the bipolar transistor.

27. The method according to claim 24, wherein the active area comprises a first semiconductor region with a first type of conductivity, and a second semiconductor region with a second type of conductivity different from the first type of conductivity; wherein the floating gate transistor is in the first semiconductor region and has an annular gate including an annular part of the layer of gate material; wherein the control gate is in the second semiconductor region; and wherein the layer of gate material comprises a second part above the control gate and a connecting part connecting the annular part and the second part.

28. The method according to claim 27, wherein a source and a drain of the floating gate transistor are defined by areas with the second type of conductivity and within the first semiconductor region; and wherein the connecting part has a transverse dimension defined by an etching fineness of a manufacturing method.

29. The method according to claim 27, wherein a source and a drain of the floating gate transistor are defined by areas with the second type of conductivity and within the first semiconductor region; and further comprising a parasitic transistor between the floating gate transistor and the control gate, and a specific implanted area in the first semiconductor region under the connecting part to modify a threshold voltage of the parasitic transistor.

30. The method according to claim 27, further comprising forming a main semiconductor box with the first type of conductivity and incorporating the first semiconductor region of the active area, the main semiconductor box containing a secondary semiconductor box with the second type of conductivity and incorporating the second semiconductor region of the active area, and wherein the PN junctions electrically isolating the floating gate transistor from the control gate comprise PN junctions between the main and secondary semiconductor boxes.

31. The method according to claims 24, further comprising forming a biasing unit with a memory cell programming state, a memory cell read state, and a memory cell erase state, to apply predetermined voltages to the source, the drain and the substrate of the floating gate transistor and the control gate, wherein a highest absolute value of the voltage applied to the floating gate transistor substrate is used for an N type substrate, and a lower absolute value is used for a P type substrate.

32. The method according to claim 31, wherein the voltage applied to the control gate in the programming state is equal to a substrate voltage.

33. The method according to claim 31, wherein a difference between the drain and source voltages, in the read state, is limited to an absolute value of 1 volt.

34. The method according to claim 24, wherein the floating gate transistor comprises a PMOS transistor.

35. The method according to claim 24, wherein the memory device is one of an EEPROM and a FLASH type memory.

* * * * *